(12) United States Patent
Van Keer et al.

(10) Patent No.: US 9,870,316 B2
(45) Date of Patent: *Jan. 16, 2018

(54) BIDIRECTIONAL COUNTER IN A FLASH MEMORY

(71) Applicant: Proton World International N.V., Diegem (BE)

(72) Inventors: Ronny Van Keer, Hoeilaart (BE); Guillaume Docquier, Liège (BE)

(73) Assignee: PROTON WORLD INTERNATIONAL N.V., Zaventem (BE)

( * ) Notice: Subject to any disclaimer, the term of this patent is extended or adjusted under 35 U.S.C. 154(b) by 0 days.

This patent is subject to a terminal disclaimer.

(21) Appl. No.: 15/243,359

(22) Filed: Aug. 22, 2016

(65) Prior Publication Data

US 2017/0004071 A1  Jan. 5, 2017

Related U.S. Application Data

(63) Continuation of application No. 14/634,386, filed on Feb. 27, 2015, now Pat. No. 9,448,926.

(30) Foreign Application Priority Data

Apr. 30, 2014 (FR) ...................................... 14 53938

(51) Int. Cl.
| | |
|---|---|
| G06F 12/00 | (2006.01) |
| G06F 13/00 | (2006.01) |
| G06F 12/02 | (2006.01) |
| G06F 9/30 | (2006.01) |
| G11C 16/10 | (2006.01) |
| H03K 21/40 | (2006.01) |
| H03K 23/56 | (2006.01) |

(52) U.S. Cl.
CPC ........ *G06F 12/0246* (2013.01); *G06F 9/3001* (2013.01); *G11C 16/105* (2013.01); *H03K 21/403* (2013.01); *H03K 23/56* (2013.01); *G06F 2212/7207* (2013.01)

(58) Field of Classification Search
None
See application file for complete search history.

(56) References Cited

U.S. PATENT DOCUMENTS

| | | | | |
|---|---|---|---|---|
| 5,724,540 A * | 3/1998 | Kametani | ................. | G06F 9/34 711/168 |
| 2004/0193835 A1* | 9/2004 | Devaney | ............... | G06F 9/3004 711/220 |
| 2007/0189082 A1* | 8/2007 | Berenbaum | .......... | G11C 16/102 365/185.33 |
| 2008/0028182 A1* | 1/2008 | Lee | ......................... | G11C 8/04 711/219 |
| 2009/0259877 A1* | 10/2009 | Vyssotski | ................ | G06F 7/607 713/502 |
| 2009/0313418 A1 | 12/2009 | Ross | | |

(Continued)

*Primary Examiner* — Sean D Rossiter
(74) *Attorney, Agent, or Firm* — Seed IP Law Group LLP

(57) ABSTRACT

A method of storing a counter in at least two non-volatile memory pages, including: a step of initializing a page with an initial value and then, on each update of the counter value, a step of storing an update value and an opcode associated with this value, selected from a set of opcodes, the current value of the counter being given by application of the successive update operations to the initial value of the page.

21 Claims, 2 Drawing Sheets

(56) References Cited

U.S. PATENT DOCUMENTS

| | | | |
|---|---|---|---|
| 2010/0325364 A1* | 12/2010 | Chen | G06F 12/0802 |
| | | | 711/135 |
| 2014/0085994 A1* | 3/2014 | Kronseder | G11C 29/10 |
| | | | 365/201 |
| 2015/0117106 A1* | 4/2015 | Van Keer | G06F 12/0246 |
| | | | 365/185.12 |

* cited by examiner

BIDIRECTIONAL COUNTER IN A FLASH MEMORY

BACKGROUND

Technical Field

The present disclosure generally relates to electronic circuits, such as circuits using a flash memory. The present disclosure relates to the forming of a counter having its value stored in a flash memory or in an EEPROM-type memory.

Description of the Related Art

In many applications, the result of a counter needs to be non-volatilely stored so that it is kept independently from the circuit power supply.

Such is particularly the case in microcircuit cards which integrate a microprocessor and at least one non-volatile memory, and more generally in any electronic circuit requiring non-volatile memory counting elements.

BRIEF SUMMARY

Due to the development of flash-type memories, it would be desirable to be able to use such memories to store the values of counters.

Further, it would be desirable to have a counter in a non-volatile memory (flash or EEPROM), which can be incremented or decremented.

An embodiment provides a method of storing a counter in at least two non-volatile memory pages, comprising: initializing a page with an initial value, and for each update of the counter value, storing an update value and an opcode associated with this value, selected from among a set of opcodes, the current value of the counter being given by application of the successive update operations to the initial value of the page.

According to an embodiment, when a page is full, its final value is calculated, and then stored as the initial value of the next page.

According to an embodiment, the method comprises an initial step where all the memory pages intended for the counter are initialized in a first state.

According to an embodiment, the opcodes comprise at least one code from among addition and subtraction.

According to an embodiment, the opcodes comprise a code for erasing an entire page of the memory.

According to an embodiment, the opcodes comprise a code for erasing the previous operation.

According to an embodiment, a page comprises 32, 64, 128, 256, 512, 1,024, or 2,048 bytes.

An embodiment provides a flash memory programmed according to the above method.

An embodiment provides an electronic circuit comprising such a flash memory.

In an embodiment, a method comprises: storing a counter value using at least two non-volatile memory pages of a memory, the storing including: storing an initial counter value in a page of the at least two non-volatile memory pages; and for each update of the stored initial counter value, storing an update value and an opcode associated with the update value in the page of the at least two pages; and determining a current value of the counter based on the stored initial value, stored update values and stored opcodes. In an embodiment, the method comprises: when the page is full, calculating the current value of the counter; and storing the calculated current value of the counter as an initial counter value in another page of the at least two non-volatile memory pages. In an embodiment, the method comprises: initializing the at least two non-volatile memory pages to a first state. In an embodiment, the opcodes are selected from a set of opcodes comprising an addition opcode and a subtraction opcode. In an embodiment, the opcodes are selected from a set of opcodes comprising an erase code. In an embodiment, the opcodes are selected from a set of opcodes comprising a code to cancel a previous operation. In an embodiment, a page comprises one of 32, 64, 128, 256, 512, 1,024, and 2,048 bytes.

In an embodiment, an apparatus comprises: a non-volatile memory; and circuitry configured to: store a counter value using at least two pages of the non-volatile memory, the storing including: storing an initial counter value in a page of the at least two pages; and for each update of the stored initial counter value, storing an update value and an opcode associated with the update value in the page of the at least two pages; and determine a current value of the counter based on the stored initial value, stored update values and stored opcodes. In an embodiment, when the page is full the circuitry is configured to: calculate the current value of the counter; and store the calculated current value of the counter as an initial counter value in another page of the at least two pages. In an embodiment, the circuitry is configured to selectively initialize the at least two pages to a first state. In an embodiment, the opcodes are selected from a set of opcodes comprising an addition opcode and a subtraction opcode. In an embodiment, the opcodes are selected from a set of opcodes comprising an erase code. In an embodiment, the opcodes are selected from a set of opcodes comprising a code to cancel a previous operation. In an embodiment, the non-volatile memory is a flash memory.

In an embodiment, a system comprises: a bus system; and control circuitry configured to: control storage of a counter in a plurality of pages of a non-volatile memory, the storing including: storing an initial counter value in a page of the plurality of pages; and for each update of the stored initial counter value, storing an update value and an opcode associated with the update value in the page of the plurality of pages; and determine a current value of the counter based on the stored initial value, stored update values and stored opcodes. In an embodiment, when the page is full the control circuitry is configured to: calculate the current value of the counter; and store the calculated current value of the counter as an initial counter value in another page of the plurality of pages. In an embodiment, the control circuitry is configured to selectively initialize the plurality of pages to a first state. In an embodiment, the system comprises the non-volatile memory. In an embodiment, the non-volatile memory comprises a flash memory. In an embodiment, the system comprises a near-field communication router including the non-volatile memory.

In an embodiment, a non-transitory computer-readable medium's contents cause a counter to perform a method, the method comprising: storing a counter value using a plurality of pages of a non-volatile memory, the storing including: storing an initial counter value in a page of the plurality of pages; and for each update of the stored initial counter value, storing an update value and an opcode associated with the update value in the page of the plurality of pages; and determining a current value of the counter based on the stored initial value, stored update values and stored opcodes. In an embodiment, the method comprises: when the page is full: calculating the current value of the counter; and storing the calculated current value of the counter as an initial counter value in another page of the plurality of pages. In an embodiment, the method comprises selecting the opcodes from a set of opcodes including at least one of an addition opcode and a subtraction opcode.

DETAILED DESCRIPTION

Figure 1:
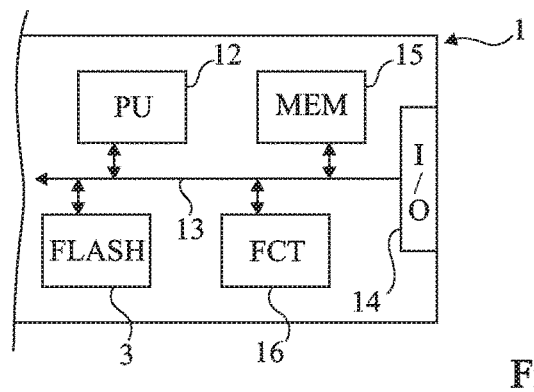
FIG. 1 is a block diagram of an example of an electronic circuit of the type to which the embodiments which will be described apply.

The same elements have been designated with the same reference numerals in the different drawings. For clarity, only those acts and elements which are useful to the understanding of the embodiments to be described have been shown and will be detailed. In particular, the electric behavior of a flash or EEPROM memory during write, read, and erase steps have not been detailed, the described embodiments being compatible with usual flash memory and EEPROM technologies. Further, applications using the updating of a counter to be stored in a flash or EEPROM memory have not been detailed either, the described embodiments being here again compatible with usual applications.

Using a non-volatile memory to store a counter raises an issue when the number of erase steps is desired to be minimized.

Conventionally, when a counter is stored in an EEPROM, the programming and the erasing are performed in bytes or in words in the memory, which provides a sufficient granularity.

On the one hand, it would be desirable to minimize the number of erase operations to increase the memory lifetime.

On the other hand, such an operation is incompatible with a flash memory.

A flash memory is programmed from an initial state to states 0 (non-conductive states of the cells). This means that the memory cells should be set to a high state and that, to store a datum, it is chosen either not to act on the bit state, or to program this bit to 0.

An EEPROM has a similar programming, but from an initial state to states 1.

It should be noted that the reference to a state 1 or to a state 0 to designate respectively charged or discharged memory points is purely conventional.

Further, an erasing (setting back to the initial state) is necessarily performed on a whole memory page. A page is defined as being the minimum size capable of being simultaneously addressed to be erased. In practice, this corresponds to the size of a register receiving the data in series to transfer them in parallel to the memory plane for storage. Typically, a page currently comprises, in a flash memory, 32, 64, 128, 256, 512, 1,024, or 2,048 bytes.

Now, a counter requires switching the state of a single bit (or of a few bits, according to the increment/decrement step).

Be it in a flash memory or in an EEPROM, the page erasing operation is relatively long (typically in the order of a few milliseconds) as compared with a byte programming operation (typically in the order of some ten microseconds).

A process comprising erasing the page to program the new counter state for each increment would take too much time. In particular, in many applications, the time available to write into the non-volatile memory is limited.

This is particularly true in applications using a contactless near-field communication technology (NFC) since the duration of the transaction between two communicating elements is only temporary and risks being interrupted at any time. Now, the use of a counter in a non-volatile memory is, in such applications, often in relation with safety issues in terms of access to certain data. The reliability of the counter is a concern. So-called atomicity procedures may then have to be implemented to improve the reliability. However, such procedures further increase the need to update data in the non-volatile memory.

FIG. 1 schematically shows, in the form of blocks, an example of an electronic circuit 1 to which the embodiments which will be described may apply. The circuit 1 comprises a processing unit 12 (PU) capable of communicating, over one or a plurality of data, address, and control buses 13, with different elements including, for example, an input/output interface 14 (I/O) of communication with the outside of circuit 1, one or a plurality of volatile or non-volatile memories 15 (MEM), one or a plurality of functions (symbolized by a block 16, FCT) associated with the application, and at least one flash memory 3 (FLASH) or EEPROM into which a counter is desired to be stored. Other elements are capable of being connected to buses 13 and/or of being comprised in the circuit. Memory 3 may be external to circuit 1.

The example of a flash memory to store the counter will be considered hereafter. However, the techniques which will be described also apply to the management of a counter stored in an EEPROM, although write and erase operations do not necessarily have the same granularity.

Figure 2:
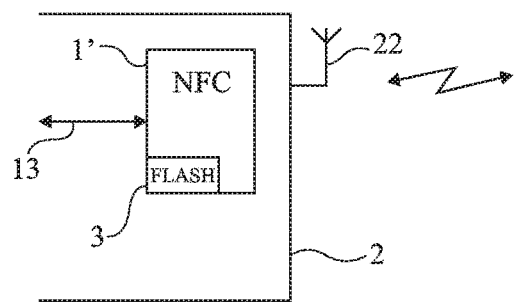
FIG. 2 very schematically illustrates in the form of blocks an example of a system using an NFC router.

FIG. 2 is a simplified representation of an example of a device 2 comprising one or a plurality of electronic circuits 1' forming a near-field communication router (NFC) capable of communicating via different buses 13 with the rest of device 2. The NFC router is used as an interface between the different elements of device 2 and an antenna 22 of near-field communication with a neighboring device, not shown. In the example of FIG. 2, the NFC circuit comprises at least one flash memory 3.

An embodiment has at least one counter having its value stored in the flash memory.

Figure 3:
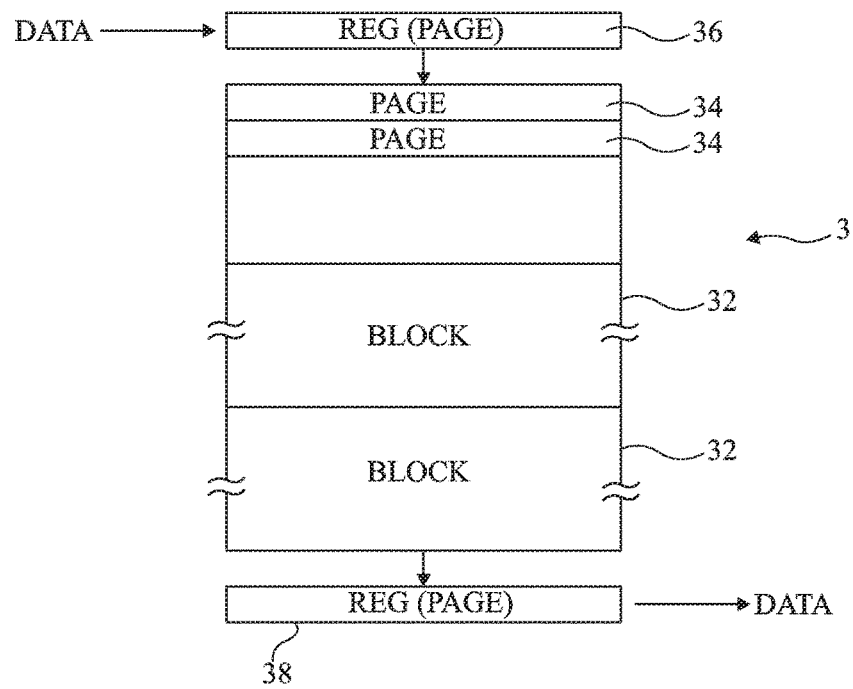
FIG. 3 is a simplified representation of an example of a flash memory.

FIG. 3 very schematically illustrates an example of architecture of a flash memory 3, such a memory being generally organized in blocks 32 (BLOCK), each comprising a plurality of pages 34 (PAGE), each having a given number of bytes, for example, 512, 1,024, or 2,048 bytes. The writing of data DATA into memory 3 or the erasing are performed via an input register 36 (REG). The data are typically sent in a series communication, or in bytes, into write register 36, which is then discharged in parallel towards a memory block. In read mode, the addressing of an area also results in the reading of a page through an output register 38 which outputs the read data.

The representation of FIG. 3 is simplified and the different control and addressing circuits have not been illustrated.

The normal use of a flash memory to store data having a size smaller than one page would take too much time. Indeed, for each new value to be stored into the counter, it would be necessary to erase the entire page to be able to reprogram a new value.

In the embodiments which will be described, it is provided to assign several pages (at least two) to the counter and to initialize these pages by erasing them (e.g., filling them with states 1, or FF in hexadecimal notation). Then, instead of storing the counter value into the memory, an initial value of the counter is stored in the memory, followed by a series of increment or decrement values and the operations associated therewith.

Thus, the control circuit of the counter (processing unit 12) manages at least one and possibly more (e.g., four) opcodes allowing the operation of the counter in the non-volatile memory. In an embodiment, four opcodes may be:

No operation (optional): this operation amounts to canceling the just previous operation;

Addition: this operation comprises incrementing the value of the counter of the operand associated with the opcode;

Subtraction: this operation comprises decrementing the value of the counter of the operand associated with the opcode; and Erasing (optional): this operation amounts to deleting a full page (e.g., entirely setting it to 1 (FF)).

During the writing into the counter, that is, of an increment or decrement, the processing unit managing the counter writes, into the memory, an opcode and an operand associated with this code.

During the reading of the counter value, the processing unit reads the initial value of the page stored in the first word of this page, as well as the different operations (opcodes and operands) stored in the active page.

When a page is full, the next page is initialized by storing as an initial value the result of the previous page (initial value updated with all the page operations). Thus, the processing unit does not need recalculating all the pages for each reading operation in order to obtain the current value of the counter, and only needs calculating the current page.

An embodiment facilitates a fast writing in bytes, with the relatively long erasing steps (as compared with a write operation) reserved to when the entire page is full.

It is noted that a flash memory is read in full pages anyway. Accordingly, it is not prejudicial to have to read an entire page in order to calculate the current value of the counter.

Figure 4:
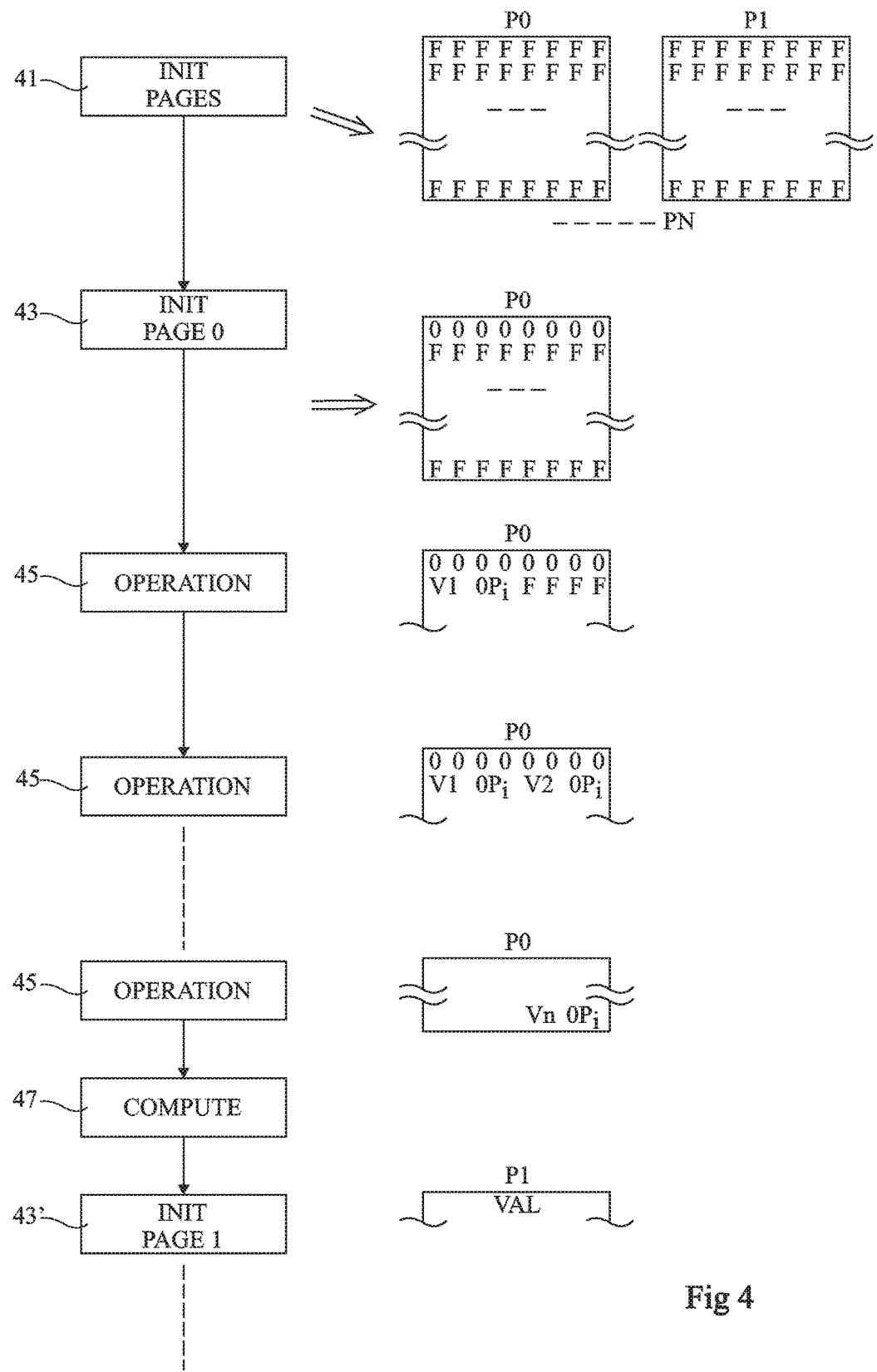
FIG. 4 illustrates an embodiment of the method of programming a counter in a flash memory.

FIG. 4 very schematically illustrates an embodiment of a method of updating a counter in a flash memory.

In a counter initialization phase, it is started by initializing (block 41, INIT PAGES) all the pages assigned to the counter. Such an initialization corresponds to filling all the bits at state 1. In FIG. 4, the content of the bytes has been written in hexadecimal notation. Thus, in the example of FIG. 4, each line comprises 8 bytes.

In an embodiment, four bytes are assigned to each counter update operation (opcode and operand).

Once the pages have been initialized, the first page is initialized (block 43, INIT PAGE 0) by storage of this initial value into its first address. For example, this initialization is at zero value 00 and the four first bytes of the page are written at 0.

The counter is then ready to be used.

In a first operation of updating the counter value, the processing unit sends an operation (block 45, OPERATION) representing the increment or the decrement to be assigned to the counter. Opcode OPi corresponding to this operation and its operand (V1) are stored at the next address in first page P0 of the memory.

Depending on applications, the processing unit may cause or not, before writing, the reading of the current value of the counter.

During the counter lifetime, update operations (block 45, OPERATION) are successively executed and progressively fill the first memory page (for example V2, OPi, . . . , Vn, OPi).

When page P0 is full, at the next write operation, the control unit starts by calculating (block 47, COMPUTE) the current value of the counter from the initial value (00) and the n update operations stored in page P0. Value VAL is then stored as an initial value in the next page P1 (block 43', INIT PAGE 1). After, the update operations are carried out from value VAL. Thus, rather than recalculating the entire content of the counter from the origin, it is enough to calculate that of the current page.

In an embodiment, once a page is full and its final value has been transferred as an initial value to the next page, the page is erased, that is, all its bits are set to 1. This facilitates protecting the counter by erasing its history.

Thus, a page may be used again by the counter when another page is full. For example, in a simplified embodiment, the counter only uses two pages and alternates from one page to the other.

In an embodiment, the counter may use one or a plurality (e.g., four) possible opcodes. For example, for a strictly increasing counter, the subtraction opcode is not used. Conversely, for a strictly decreasing counter, the initial value may be FF and the addition opcode is not used.

However, according to an embodiment, the counter is increasing and decreasing, to enable to increment and to decrement a same counter in a non-volatile memory.

The optional no-operation code corresponds to canceling the previous operation. For example, if an operation of rank i has increment the counter by 3 and the next operation desires to decrement it by 3, one may, instead of storing the two successive increment and decrement operations, cancel the increment operation. To achieve this, the memory area storing the increment operation may be canceled (set to value 0). The line is lost but only one line has been used instead of two. Such an operation is for example used in a counter of protection against attacks of an integrated circuit where the counter is generally incremented before the function to be monitored, and then decremented by the same value at the end of the function if no attack has been detected.

The selection of the size of the pages conditions the time necessary to calculate the counter value (time required to calculate the operations from the beginning of the page).

An embodiment may be fast, particularly as compared with the time required to erase a page from the flash memory (or EEPROM).

Various embodiments have been described. Various alterations, modifications, and improvements will readily occur to those skilled in the art. In particular, the practical implementation of the described embodiments is within the abilities of those skilled in the art based on the functional indications given hereabove and by using circuits usual per se. Particularly, the organization of the addressing of the non-volatile memory and the generation of the signals adapted to its control and to this addressing use techniques usual per se.

Such alterations, modifications, and improvements are intended to be part of this disclosure, and are intended to be within the spirit and the scope of the present disclosure. Accordingly, the foregoing description is by way of example only and is not intended to be limiting.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
assigning at least two non-volatile memory pages of a memory to store counter value information;
storing an initial counter value in a page of the at least two non-volatile memory pages;
for each update of the stored initial counter value, storing an update value and an opcode associated with the update value in the page of the at least two non-volatile memory pages; and
determining a current counter value based on the stored initial value, stored update values and stored opcodes.

2. The method of claim 1, comprising:
when the page is full,
calculating the current counter value; and
storing the calculated current counter value as an initial counter value in another page of the at least two non-volatile memory pages.

3. The method of claim 1, comprising:
initializing the at least two non-volatile memory pages to a first state.

4. The method of claim 1 wherein the opcodes are selected from a set of opcodes comprising an addition opcode and a subtraction opcode.

5. The method of claim 1 wherein the opcodes are selected from a set of opcodes comprising an erase code.

6. The method of claim 1 wherein the opcodes are selected from a set of opcodes comprising a code to cancel a previous operation.

7. The method of claim 1 wherein a page comprises one of 32, 64, 128, 256, 512, 1,024, and 2,048 bytes.

8. An apparatus, comprising:
a non-volatile memory; and
circuitry, which, in operation:
assigns at least two pages of the non-volatile memory to store counter value information;
stores an initial counter value in a page of the at least two pages;
for each update of the stored initial counter value, stores an update value and an opcode associated with the update value in the page of the at least two pages; and
determines a current counter value based on the stored initial value, stored update values and stored opcodes.

9. The apparatus of claim 8 wherein when the page is full, the circuitry, in operation:
calculates the current counter value; and
stores the calculated current counter value as an initial counter value in another page of the at least two pages.

10. The apparatus of claim 8 wherein the circuitry, in operation, selectively initializes the at least two pages to a first state.

11. The apparatus of claim 8 wherein the circuitry, in operation, selects opcodes from a set of opcodes comprising an addition opcode and a subtraction opcode.

12. The apparatus of claim 8 wherein the circuitry, in operation, selects opcodes from a set of opcodes comprising an erase code.

13. The apparatus of claim 8 wherein the circuitry, in operation, selects opcodes from a set of opcodes comprising a code to cancel a previous operation.

14. The apparatus of claim 8 wherein the non-volatile memory is a flash memory.

15. The apparatus of claim 14, comprising:
a near-field communication router including the flash memory.

16. A system, comprising:
means for routing near-field communications; and
means for maintaining a counter value in a plurality of pages of a non-volatile memory by:
storing an initial counter value in a page of the plurality of pages;
for each update of the stored initial counter value, storing an update value and an opcode associated with the update value in the page of the plurality of pages; and
determining a current counter value based on the stored initial value, stored update values and stored opcodes.

17. The system of claim 16 wherein when the page is full, the means for maintaining the counter value:
calculates the current counter value; and
stores the calculated current counter value as an initial counter value in another page of the plurality of pages.

18. The system of claim 16 wherein the means for maintaining the counter value selectively initializes the plurality of pages to a first state.

19. A non-transitory computer-readable medium whose contents cause a counter to perform a method, the method comprising:
storing an initial counter value in a first page of a plurality of pages of a non-volatile memory;
updating the stored initial counter value one or more times by, for each update, storing an update value and an opcode associated with the update value in the first page of the plurality of pages of the non-volatile memory; and when the first page is full, calculating a current counter value based on the stored initial counter value, the stored update values and the stored opcodes; and storing the calculated current counter value as an initial counter value in a second page of the plurality of pages.

20. The non-transitory computer-readable medium of claim 19 wherein the method comprises selecting the opcodes from a set of opcodes including at least one of an addition opcode and a subtraction opcode.

21. The non-transitory computer-readable medium of claim 19 wherein the non-volatile memory is a flash memory of a near-field communication device.

* * * * *